United States Patent
Guntermann et al.

(10) Patent No.: US 11,098,733 B2
(45) Date of Patent: Aug. 24, 2021

(54) MOUNTING ASSEMBLY WITH LEADED ELECTRONIC POWER COMPONENTS AND THEIR ASSEMBLY WITH A MOTOR HOUSING

(71) Applicant: Hanon Systems, Daejeon (KR)

(72) Inventors: Bernd Guntermann, Lennestadt (DE); Bernadette Goebbels, Cologne (DE); Stephan Werker, Merzenich (DE)

(73) Assignee: Hanon Systems, Daejeon (KR)

( * ) Notice: Subject to any disclaimer, the term of this patent is extended or adjusted under 35 U.S.C. 154(b) by 175 days.

(21) Appl. No.: 16/390,645

(22) Filed: Apr. 22, 2019

(65) Prior Publication Data
US 2019/0331132 A1    Oct. 31, 2019

(30) Foreign Application Priority Data
Apr. 30, 2018  (DE) .......................... 102018110361.1

(51) Int. Cl.
*F04D 29/60*    (2006.01)
*B60H 1/32*     (2006.01)
(Continued)

(52) U.S. Cl.
CPC ......... *F04D 29/601* (2013.01); *B60H 1/3229* (2013.01); *F04D 25/068* (2013.01);
(Continued)

(58) Field of Classification Search
CPC .. F04D 29/601; F04D 25/068; F04D 25/0693; B60H 1/3229; H05K 1/183;
(Continued)

(56) References Cited

U.S. PATENT DOCUMENTS 7,207,187 B2 *  4/2007  Funahashi ............... F01C 21/10
                                                  62/113
8,451,611 B2    5/2013  Nakagami et al.
(Continued)

FOREIGN PATENT DOCUMENTS

| JP | 2002083915 A | 3/2002 |
| JP | 2008258241 A | 10/2008 |
| JP | 2011157873 A | 8/2011 |

*Primary Examiner* — Timothy J Thompson
*Assistant Examiner* — Michael F McAllister
(74) *Attorney, Agent, or Firm* — Norton Rose Fulbright US LLP; James R. Crawford (57) ABSTRACT

A mounting assembly with wire-leaded electronic power components for an inverter of an electric compressor of a climate control system includes a support frame structure with a bottom forming an upper side and an underside, and a multiplicity of passages from the upper side to the underside for securement elements for securing the support frame structure on a motor housing. On the underside of the bottom a hollow receiving volume is implemented. A leaded power module or power semiconductor is embedded. In each hollow receiving volume is a contact region for localized contact in places of the hollow receiving volume with an upwardly facing surface of power semiconductor or power module. The opposite, downwardly facing surface of the semiconductor or the power module forms a portion of the lower outer surface area of the mounting assembly. An assembly of the mounting assembly with a compressor motor housing is also provided.

20 Claims, 8 Drawing Sheets

(51) Int. Cl.
*F04D 25/06* (2006.01)
*H05K 1/18* (2006.01)

(52) U.S. Cl.
CPC ......... *F04D 25/0693* (2013.01); *H05K 1/183* (2013.01); *H05K 2201/10272* (2013.01)

(58) Field of Classification Search
CPC ....... H05K 2201/10272; H05K 1/0233; H05K 7/20909; H05K 3/34; H05K 2201/10015; H05K 2201/10166; F24F 11/89; F24F 13/20
USPC .......................................................... 361/810
See application file for complete search history.

(56) References Cited

U.S. PATENT DOCUMENTS

| | | | |
|---|---|---|---|
| 10,186,935 B2* | 1/2019 | Hattori | F04B 35/04 |
| 2017/0018367 A1* | 1/2017 | Werker | H01G 9/0003 |
| 2018/0198267 A1* | 7/2018 | Goebbels | H05K 5/006 |
| 2018/0337499 A1* | 11/2018 | Goebbels | H01R 43/04 |

* cited by examiner

MOUNTING ASSEMBLY WITH LEADED ELECTRONIC POWER COMPONENTS AND THEIR ASSEMBLY WITH A MOTOR HOUSING

This application claims priority from German Patent Application No. 102018110361.1 filed on Apr. 30, 2018, which is hereby incorporated herein by reference in its entirety.

FIELD OF THE INVENTION

The invention relates to a mounting assembly with wire-leaded electronic power components, in particular for an inverter of an electric compressor of a climate control system. The invention, furthermore, relates to an assembly of this mounting assembly with a motor housing of the compressor.

BACKGROUND OF THE INVENTION

Electric compressors of motor vehicle climate control systems using brushless electric motors require inverter electronics that convert direct current from the power grid into the requisite multi-phase alternating current. This is completed using a configuration with several half-bridges, which is formed by arranging discrete leaded power semiconductors (IGBTs or Mosfets) or through an integral leaded power module. A power module comprises the disposition of at least two semiconductor chips on a substrate including the conductings. The multiphase current requires the connecting of the power stage of the inverter to the corresponding phase winding ends of the electric motor or to a pin of an electric housing feed-through. This connection is frequently established by busbars. The released heat, which is generated within the power semiconductors, such as for example within bipolar transistors with insulated gate (IGBTs) or metal-oxide semiconductor field-effect transistors (MOSFETs), must additionally be effectively discharged. The discharge of the heat best takes place across a suitable cooling region on the motor housing, through the interior volume of which circulates cold suction gas. A suitable contact pressure is required for this purpose with which each power semiconductor is pressed against the cooling region taking into consideration the individual thickness of the particular power semiconductor. The inverter should, lastly, be developed, preferably in the form of a simple modular inverter, such that it can be easily mounted on the main body of the compressor.

Prior art discloses arrangements in which the power semiconductor and busbars of the inverter are mounted on a conventional metal substrate. The power semiconductors and busbars must be insulated against the substrate using suitable measures. The substrate proper must be mounted onto the motor housing. The power semiconductors are conventionally insulated against the substrate by a foil having good thermal conductivity properties. Busbars are housed in separate busbar housings mounted on the metal substrate. The substrate with the mounted power semiconductors and busbars or with the busbar housing, using an intermediately placed sealing that has good heat conducting properties, is affixed using threaded connections.

OBJECTS OF THE INVENTION

The problem underlying the invention comprises in particular disposing, supporting and stabilizing the electronic power components such that, independently of the thickness of the particular power semiconductor or of the power module, each power semiconductor or power module is pressed with the appropriate contact force directly against the cooling region on the motor housing. Such an arrangement is to be, furthermore, readily mountable to the main part of the compressor, ideally in the form of a simple modular inverter.

SUMMARY OF THE INVENTION

The problem addressed by the invention is resolved by a mounting assembly with leaded electronic power components according to the characteristics of the independent claims. Further developments are specified in the dependent claims. This mounting assembly is suitable in particular manner for an inverter of an electric compressor of a climate control system. The mounting assembly comprises a support frame structure with a base that forms an upper side and an underside of the support frame structure and comprises a multiplicity of passages from the upper side to the underside for securement elements for securing the support frame structure on a motor housing. On the underside of the base a hollow receiving volume or a multiplicity of hollow receiving volumes is or are developed in which the leaded power module or the multiplicity of discrete leaded power semiconductors is embedded. In each hollow receiving volume a contact region is implemented for the localized contact of the hollow receiving volume with an upwardly facing surface of the power semiconductor or power module, while the opposing downwardly facing surface of the power semiconductor or power module forms a portion of the lower outer surface area of the mounting assembly. Between the contact region of the power semiconductor or power module there preferably exist line contact or point contact. According to the invention the support frame structure comprises above the hollow receiving volumes a resilient region which, in the direction of the thickness of the power semiconductors or of the power module, is flexible compared to the other regions of the support frame structure.

The mounting assembly with the leaded electronic power components consequently comprises a multiplicity of discrete power semiconductors or a discrete integral leaded power module as well as a support frame structure within which the multiplicity of the discrete power semiconductors or a single integral leaded power module is disposed and which can be secured on a motor housing of an electric compressor. The securement means are preferably bolts.

The mounting assembly with the leaded electronic power components comprises, where appropriate, additionally a multiplicity of busbars also disposed within the support frame structure. In the event no busbars are utilized, for example in the case of compressors in which pins of the electrical housing feedthrough are directly contacted into the printed circuit board, the mounting assembly can be solely comprised of the power semiconductors and the support frame structure. The support frame structure can be positioned underneath the printed circuit board of the inverter. According to an advantageous embodiment of the invention, the bottom of the support frame structure comprises openings through which the connector pins of the leaded power semiconductors or of the leaded power module are passed and extend so far through the support frame structure that, guided through the printed circuit board of the inverter, they can subsequently be positioned in the support frame structure and can be soldered to the printed circuit board of the inverter.

The support frame structure provides hollow receiving volumes for each power semiconductor or each power module and, if required, also provides grooves for one or more busbars. Busbars can be pressed into the grooves assigned to them and be positioned and retained by the ribs drawn through the groove providing thus a tight press fit for the corresponding busbars. The support frame structure preferably comprises grooves, adapted to the busbars, on the underside of the bottom into which grooves the busbars are secured by pressing. As already explained, the discrete power semiconductors or the power module are positioned within suitable hollow receiving volumes within the support frame structure. Like the connector pins of the leaded power semiconductors or of the leaded power module, the busbar ends can be fed through suitable openings in the bottom of the support frame structure and extend so far through the support frame structure that they can be passed through the printed circuit board of the inverter and be soldered to the printed circuit board of the inverter.

A further aspect of the invention relates to the assembly of said mounting assembly with a motor housing of a compressor. In the state mounted onto the motor housing of the compressor, the support frame structure is secured on the motor housing of the compressor by a multiplicity of securement elements, preferably bolts. The support frame structure and the power semiconductors integrated therein or the power module are pressed against a cooling region. Each hollow receiving volume for a power semiconductor or the power module within the support frame structure comprises a contact region for exerting the required press-on pressure onto the upper side of the power semiconductors. The support frame structure comprises resilient regions such that they enable the adaptation of the support frame structure to differences in the thickness of the discrete power semiconductors or of the power module by flexing the support frame structure. Bolt points and contact elements are placed such that no mechanical agreement occurs. In cases, in which discrete power semiconductors are employed, no more than two power semiconductors are preferably placed between two bolts. This ensures that all power semiconductors have sufficient contact force with respect to the cooling region. The power semiconductors can be disposed rectangularly, triangularly, irregularly or circularly. To improve thermal conductivity and to insulate electrically the power devices and busbars from the cooling region, an intermediate layer of a thermally conductive material, more precisely a layer of an electrically insulating material with good thermal conductivity properties, is preferably placed underneath the mounting assembly, which means placed between the mounting assembly and the cooling region of the motor housing. The support frame structure is preferably comprised of a synthetic material. In the event the synthetic material is not strong enough to generate the adequate contact pressure against the power devices, metal reinforcements coated with synthetic materials or synthetic materials with embedded metal reinforcements can be utilized within the support frame structure.

Further details, characteristics and advantages of embodiments of the invention will become evident based on the following description of the embodiment examples with reference to the associated drawing.

DETAILED DESCRIPTION

Figure 1A:
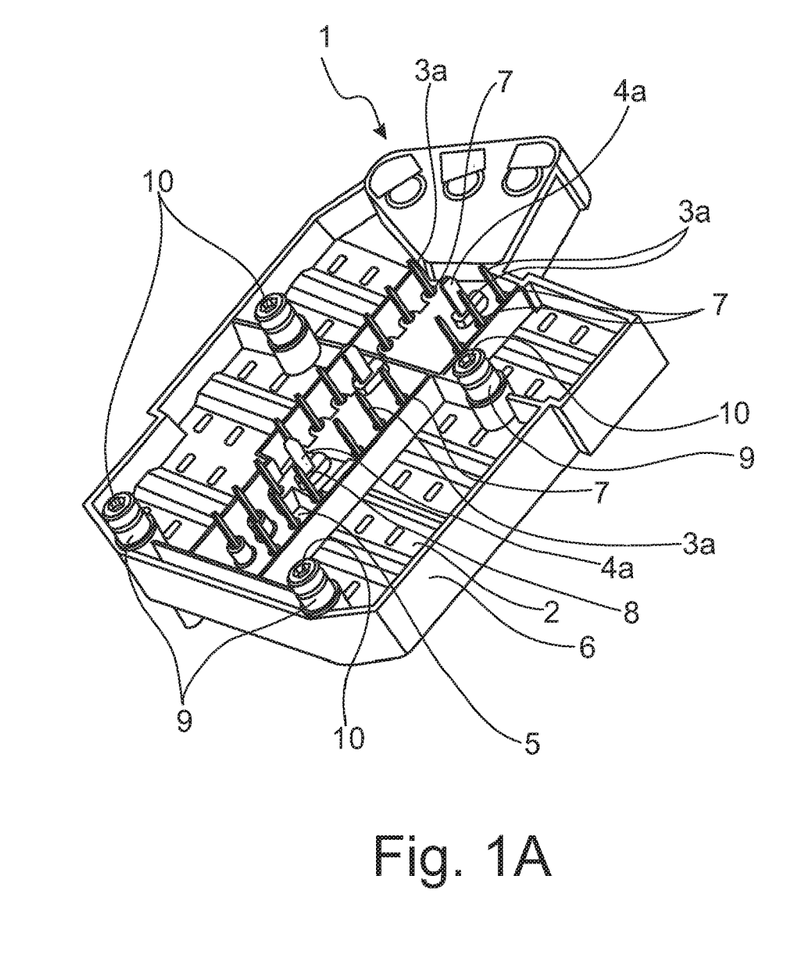
FIG. 1A shows a mounting assembly in perspective representation with view onto the upper side of a support frame structure.
Figure 1B:
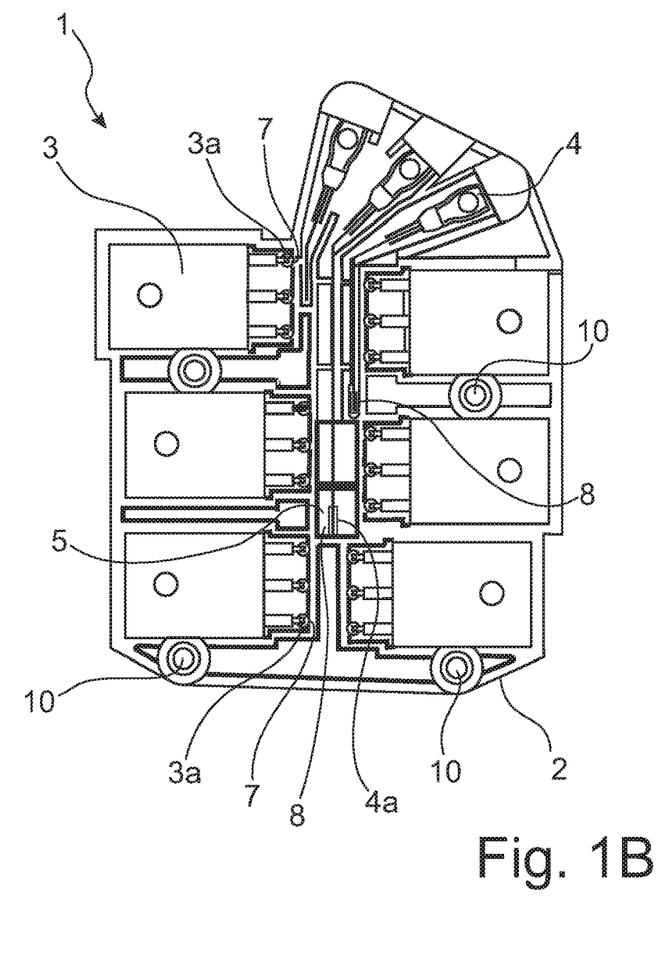
FIG. 1B shows the mounting assembly in plan view onto the underside of the support frame structure with embedded power semiconductors and busbars.

FIG. 1A and FIG. 1B show schematically the fundamental structure of a mounting assembly 1 that comprises a support frame structure 2 as well as leaded electronic power components disposed therein in the form of a multiplicity of discrete leaded power semiconductors 3 as well as of busbars 4.

FIG. 1A shows the mounting assembly 1 in a perspective view onto the upper side of the support frame structure 2, which comprises a bottom 5 encompassed by a side edging 6. The bottom 5 of the support frame structure 2 comprises various openings 7, 8, wherein through a group of openings 7 connector pins 3a of the power semiconductors 3 and through another group of openings 8 busbar ends 4a are fed. The support frame structure 2 comprises, furthermore, several, according to FIG. 1A four, sleeves 9 penetrating the bottom 5 of support frame structure 2, for guiding and staying securement elements. According to FIG. 1A, the securement elements are provided in the form of bolts whose bolt head must in each case be greater than the inner diameter of the sleeve 9 such that the bolt head can be pressed as abutment and/or press-on area against the end side of the sleeve on the upper side of the support frame structure 2 or against a washer placed on this end side. By means of bolts 10 as securement elements introduced from the upper side, the support frame structure 2 can be secured on a motor housing.

FIG. 1B shows the mounting assembly 1 in a plan view onto the support frame structure 2 with leaded power semiconductors 3 embedded in hollow receiving volumes of the support frame structure 2 with three connector pins 3*a* each that are fed through the openings 7 in the bottom 5 of the support frame structure 2, and with busbars 4 with the busbar ends 4*a* which are fed through further openings 8 in the bottom 5 of the support frame structure 2. FIG. 1B also shows the bolt ends of bolts 10 penetrating the bottom 5 of support frame structure 2.

Figure 1C:
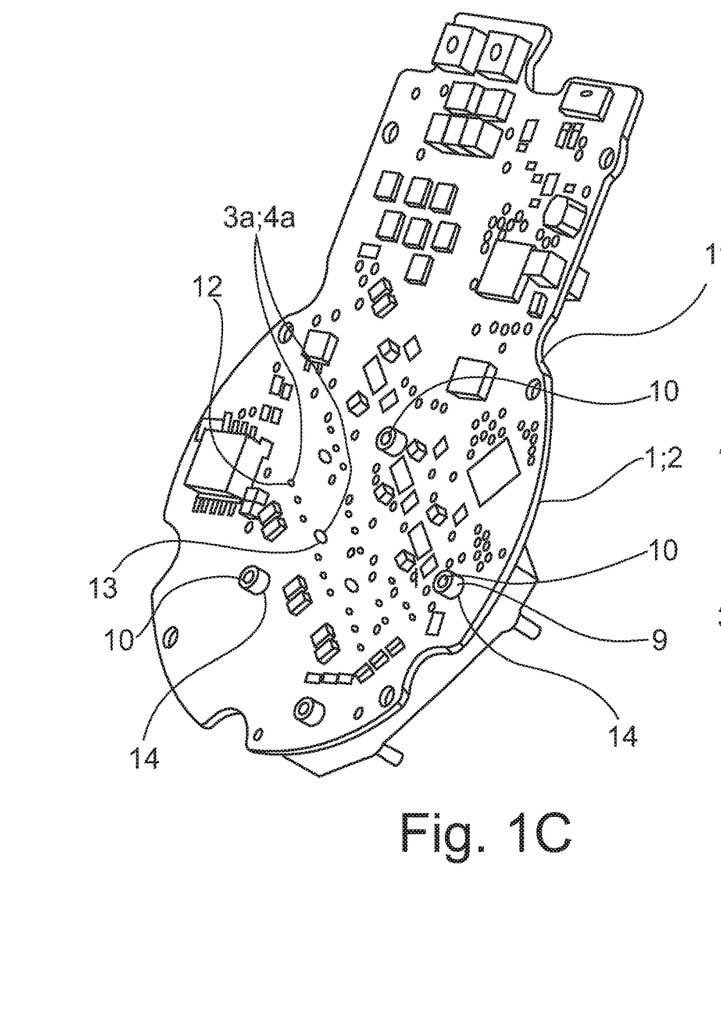
FIG. 1C shows the mounting assembly in connection with a printed circuit board with view onto the printed circuit board with the busbar ends penetrating therethrough and connector pins of the power semiconductors.

FIG. 1C shows the mounting assembly 1 in connection with an inverter printed circuit board 11 in view from above onto this printed circuit board 11. The busbar ends 4*a* and the connector pins 3*a* of the leaded power semiconductors project through the printed circuit board 11. To this end, the busbar ends 4*a* and connector pins 3*a* of the leaded power semiconductors are first inserted through the particular appropriate openings in the bottom 5 of the support frame structure 2 and extend so far through the support frame structure 2 that they can be passed through openings 12, 13 through the printed circuit board 11 resting on the support frame structure 2 and be soldered to the printed circuit board 11. A further group of openings 14 in the printed circuit board 11, however, is penetrated by said sleeves 9 which, as are provided as securement means, namely for guiding and staying the bolts 10. The bolt head of bolts 10 is herein smaller than the associated opening 14 and is not pressed as abutment and/or press-on area against the printed circuit board 11 but against the particular upper end side of sleeve 9.

Figure 1D:
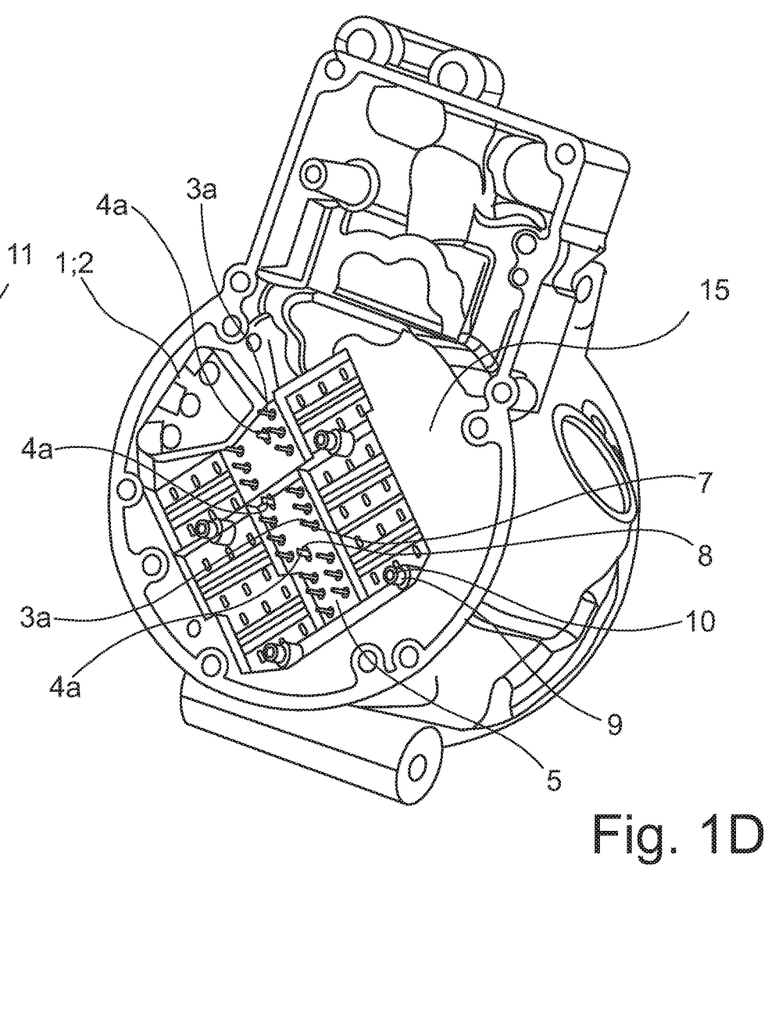
FIG. 1D shows a perspective view of a motor housing with the mounting assembly mounted thereon.

FIG. 1D shows a perspective representation of a motor housing 15 with the mounting assembly 1 mounted thereon. The connector pins 3*a* of the power semiconductors 3 and the busbar ends 4*a* are guided through the different openings 7, 8 in the bottom 5 of the support frame structure 2. The bolts 10 as securement means for securing the mounting assembly 1 on the motor housing 15 are inserted through the sleeves 9, wherein the bolt head as abutment and/or press-on area is pressed against the end side of sleeve 9 on the upper side of the support frame structure 2.

Figure 2:
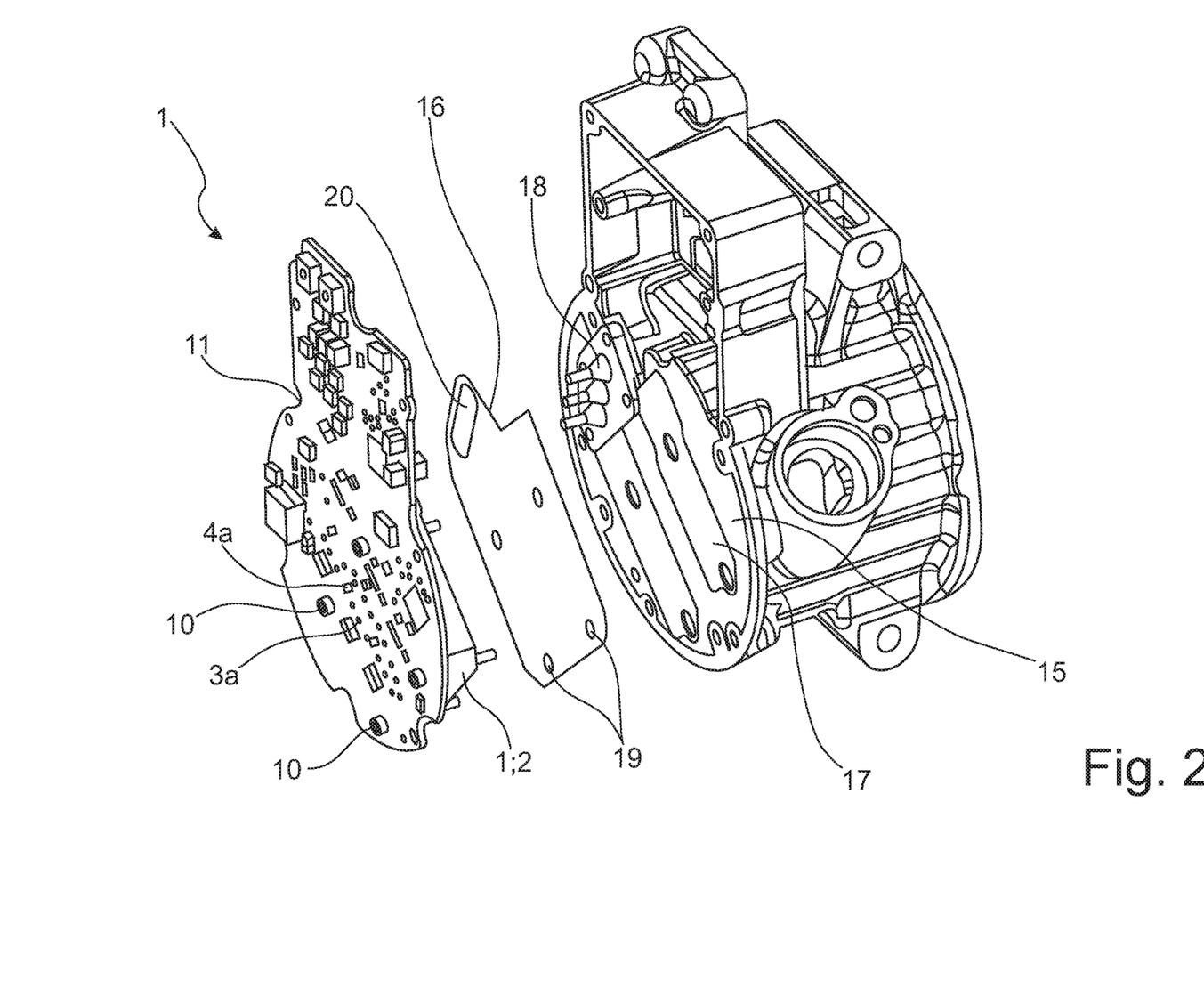
FIG. 2 is an exploded representation of an assembly of the motor housing with pins of electric housing feedthroughs and with a cooling region, an intermediate layer of a thermally conductive material as well as with the mounting assembly with printed circuit board.

FIG. 2 shows an exploded representation of the assembly of a motor housing 15, an intermediate layer 16 of an electrically insulating, thermally conductive material as well as the mounting assembly 1. The mounting assembly 1 comprises the support frame structure 2, on the underside (not visible) of which the power semiconductors are embedded in hollow receiving volumes and busbars in clearances, and bears on its upper side a printed circuit board 11 through which the connector pins 3*a* of the power semiconductors and the busbar ends 4*a* project. In the region for the mounting of support frame structure 2 the motor housing 15 comprises cooling regions 17 through which flows a coolant, as well as pins 18 of electric housing feedthroughs, oriented perpendicularly to the cooling regions, which, according to FIG. 2, are disposed in a row of three. The mounting assembly 1 is secured by means of bolts 10 on the motor housing 15, wherein the support frame structure 2 with its underside, on which leaded power semiconductors and the busbars are embedded in hollow receiving volumes, is pressed against the region of the motor housing 15 in which are located the cooling regions 17 and pins 18 of the motor housing feedthroughs. To improve the thermal conductivity and to insulate the leaded power semiconductors and busbars electrically from the cooling regions, an intermediate layer 16 of an electrically insulating, thermally conductive material is placed underneath the mounting assembly 1 such that the thermally conductive material is located between the cooling regions 17 of the motor housing 15 and the power semiconductors 3. The intermediate layer 16 has simultaneously several cutouts 19 for the bolts 10 and a larger cutout 20 for all three pins 18 of the electrical housing feedthrough.

Figure 3:
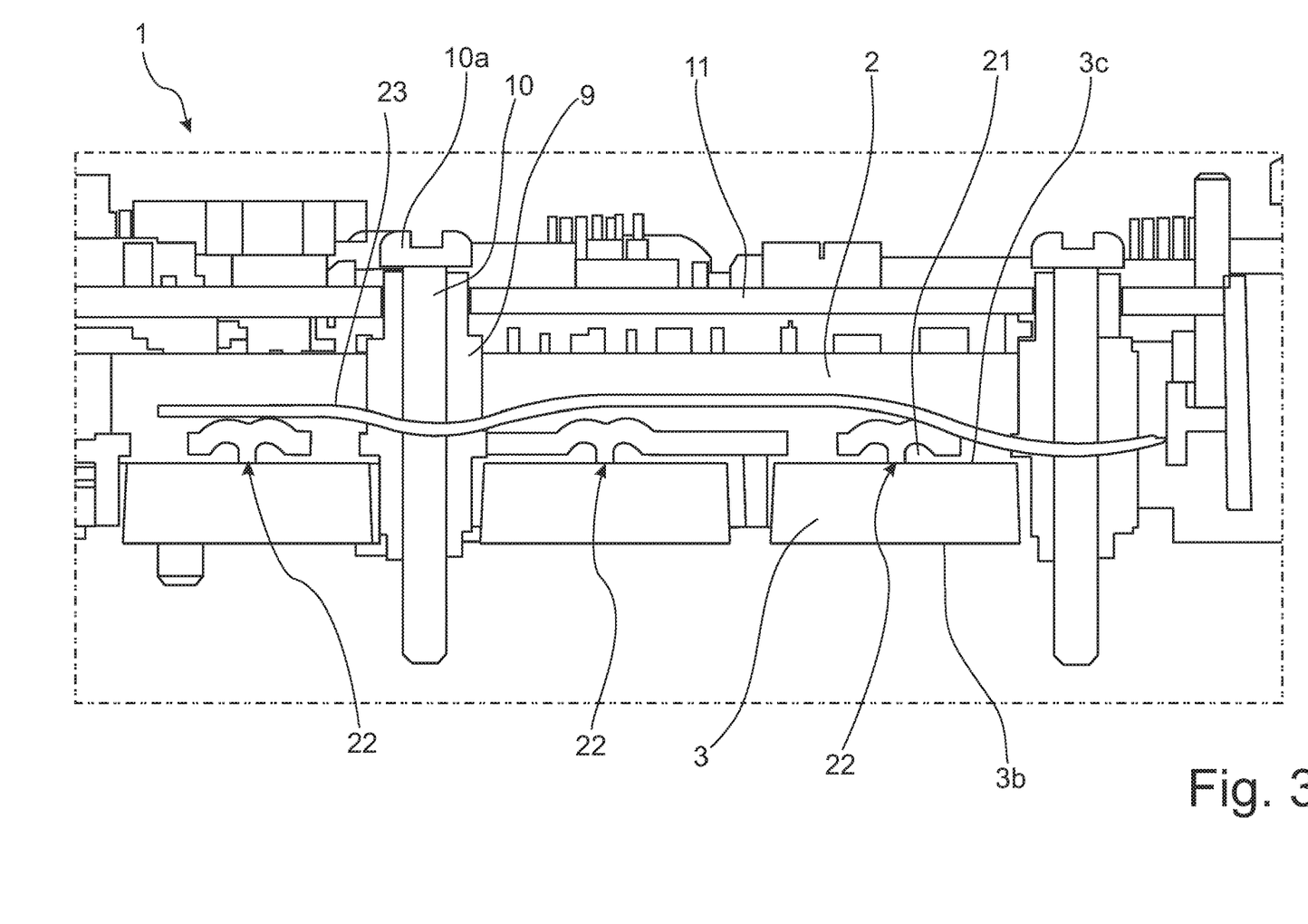
FIG. 3 is a sectional representation of the mounting assembly with the power semiconductors, in the bolted state.

FIG. 3 shows a sectional representation of the mounting assembly 1 with the leaded power semiconductors 3 after it has been bolted. The support frame structure 2 is positioned underneath the printed circuit board 11 of the inverter. The support frame structure 2 comprises on the underside hollow receiving volumes 21 for each power semiconductor 3, wherein these hollow receiving volumes 21 are downwardly open. The power semiconductors 3, in the depicted example bipolar transistors with insulated gate (IGBTs) are positioned in these hollow receiving volumes 21 and therewith within the support frame structure 2, wherein the downwardly facing surface 3*b* of power semiconductor 3 is not covered by the support frame structure 2 due to the position of the opening of the hollow receiving volume 21. Each hollow receiving volume 21 comprises a contact region 22 developed for localized contact in places of the hollow receiving volume 21 with the upper surface 3*c* of the power semiconductor 3. In the state in which the compressor has been mounted within the motor housing, depicted in FIG. 3 schematically without the motor housing, the support frame structure 2 is pressed by a multiplicity of bolts 10, that are introduced into the sleeves 9 projecting from the printed circuit board up to the underside, against the, also not depicted, cooling region of the motor housing. The bolt head 10*a* is herein pressed as an abutment and/or press-on area against the upper end face of sleeve 9. The support frame structure 2 itself has in the region above the hollow receiving volumes a resiliency such that an adaptation of the support frame structure 2 to discrepancies in the thickness of the power semiconductors 3 is enabled by the flexure of this resilient region 23 of the support frame structure 2. The flexure of the resilient region 23 of the support frame structure 2 in the bolted state is shown schematically in FIG. 3. The bolts 10 and the contact regions 22 are placed in a manner such that no mechanically static overdetermination occurs. In each case precisely two power semiconductors 3 are disposed in a row between two bolts 10. The fact that no more than two power semiconductors 3 are disposed in a row between two bolts 10 enables all power semiconductors 3 being pressed against the motor housing of the compressor with appropriate contact force with the lower surface 3*b*, uncovered by the support frame structure 2. The contact region 22 of each hollow receiving volume 21 is developed such that there is line contact between the power semiconductors 3 and the inner support frame structure 2 wherein the contact line extends perpendicularly to the direction of flexure of the resilient region 23 of the support frame structure 2.

Figure 4A:
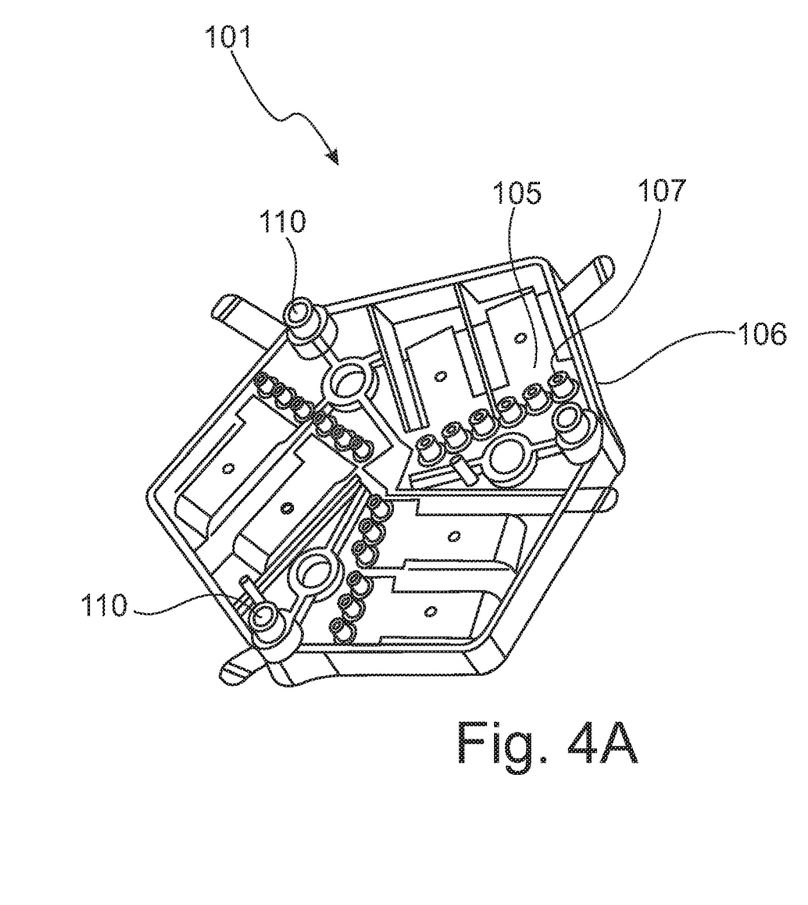
FIG. 4A shows a mounting assembly in a perspective view onto the upper side of a hexagonal support frame structure.

FIG. 4A shows a mounting assembly 101 as an embodiment example of the case that no busbars are used, for example with compressors in which the pins of the electrical housing feedthrough are directly contacted in the printed circuit board. In this case this mounting assembly 101 is solely comprised of the leaded power semiconductors 103 and the support frame structure 102. FIG. 4A shows a perspective view with view onto the upper side of 102, with a side edging 106 developed hexagonally. The bottom 105 of the support frame structure 102 comprises three rows of six linearly disposed openings 107 each, wherein each row extends from a central region of bottom 105 of the support frame structure 102 up to a region near the side edging 106. The three rows extend herein in different directions, the angle between two adjacent rows is each preferably 120°.

Through the openings 107 housing feedthroughs for the connector pins of the power semiconductors are provided. The support frame structure 102 has, moreover, according to FIG. 4A in the proximity of each second corner of the hexagonal side edging 106 an opening for the introduction of a bolt 110, whereby for these openings and for the bolts 110 a triangular arrangement results.

Figure 4B:
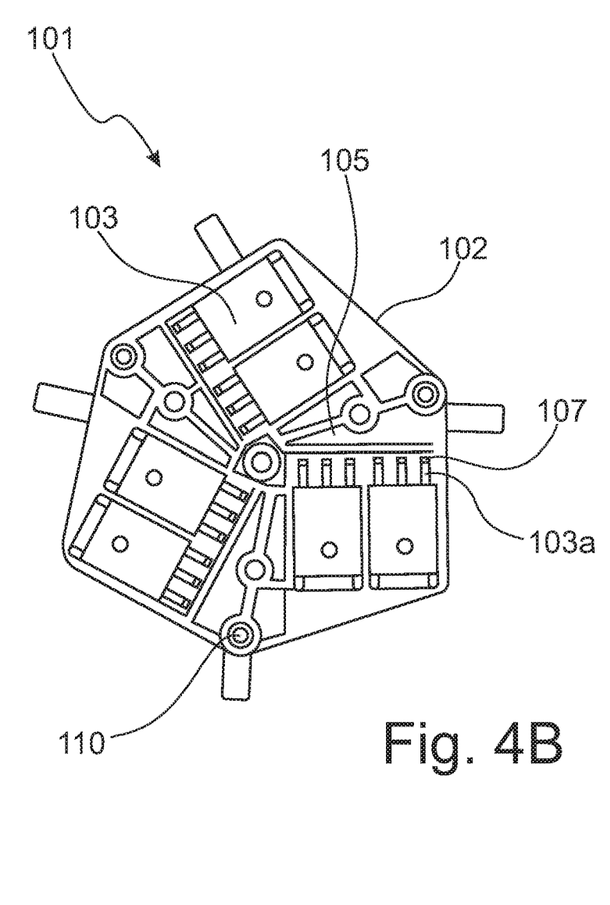
FIG. 4B shows the mounting assembly in plan view onto the underside of the hexagonal support frame structure with embedded power semiconductors.

FIG. 4B shows the mounting assembly 101 in a plan view onto the underside of the hexagonal support frame structure 102 with overall six embedded power semiconductors 103, which are disposed in pairs, that is in three groups of two each. FIG. 4B also shows the bolt ends of bolts 110 penetrating through the bottom 105 of the support frame structure 102. Each power semiconductor 103 comprises three connector pins 3a which are introduced through the openings 107 in bottom 105 of the support frame structure 102. Through the pairwise disposition of the power semiconductors 103, the overall six connector pins 103a of the adjacent power semiconductors 103 are disposed in a row such that they can be fed through corresponding six openings 107 of one of said linearly disposed rows of openings 107. FIG. 4B also shows the bolt ends of bolts 110 projecting through the bottom 105 of the support frame structure 102.

Figure 4C:
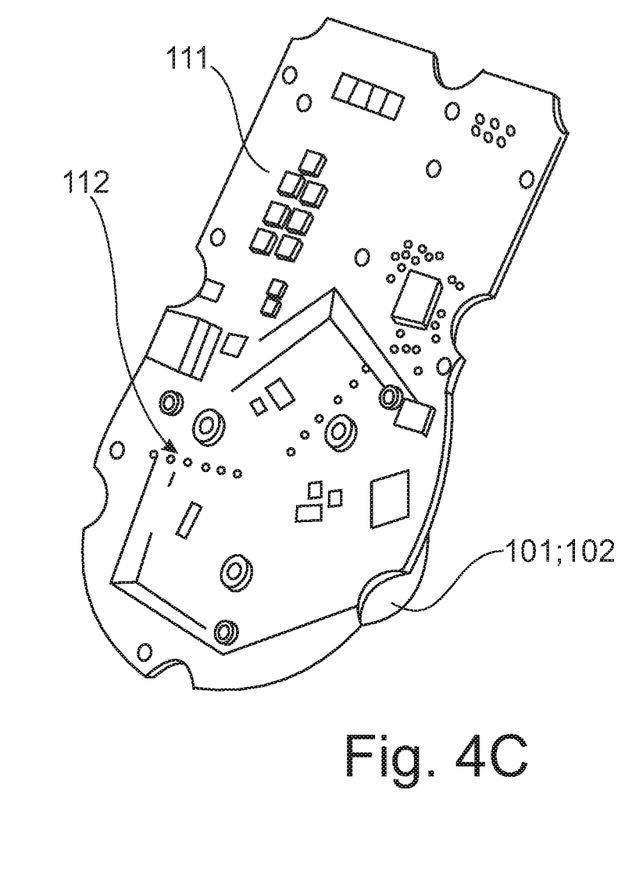
FIG. 4C shows the mounting assembly in connection with a printed circuit board with view onto the printed circuit board with the connector pins of the power semiconductors penetrating the printed circuit board.

FIG. 4C shows the mounting assembly 101 in connection with a printed circuit board 111 with view onto the printed circuit board 111 with the connector pins 103a of the power semiconductors penetrating therethrough. For this purpose, the connector pins 103a of the power semiconductors are first introduced through appropriate openings in bottom of the support frame structure 102 and extend so far through the support frame structure 102 that they can be fed through the printed circuit board 111 resting on the support frame structure 102 through openings 112 and be soldered to the printed circuit board 111.

Figure 4D:
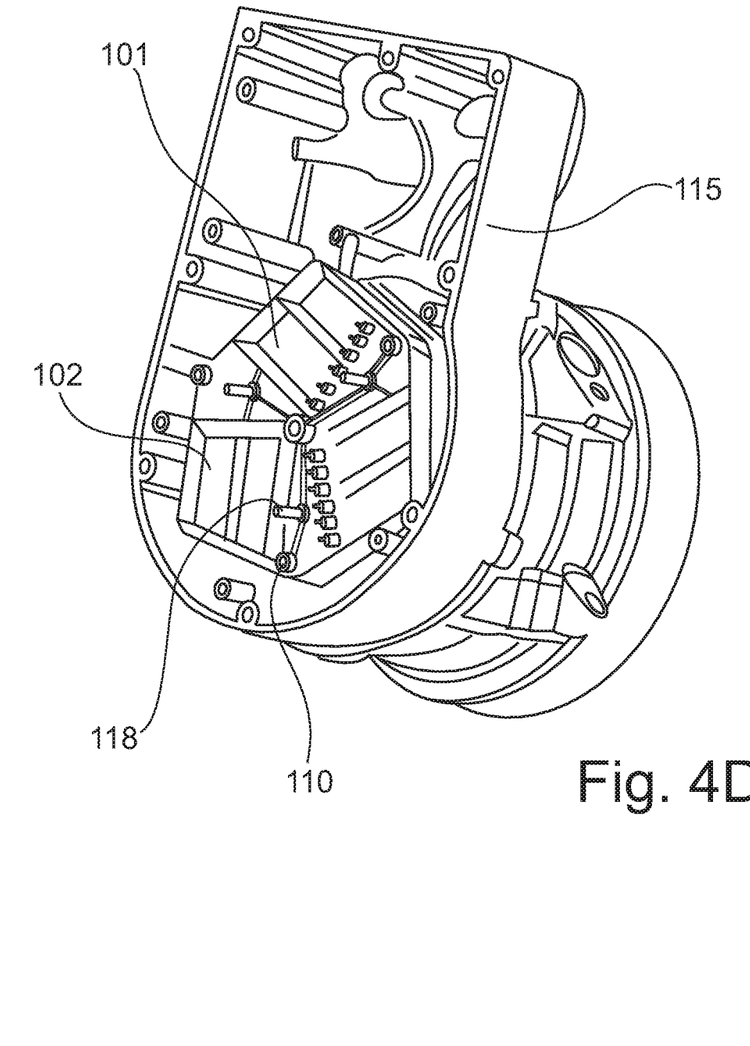
FIG. 4D shows a perspective view of a motor housing with the mounting assembly, mounted thereon by means of bolts with hexagonal support frame structure.

FIG. 4D shows a perspective view of a motor housing 115 with the mounting assembly 101, mounted thereon by means of bolts with hexagonal support frame structure 102. Through the above described several groups of openings in the bottom of the support frame structure 102 are fed the connector pins of the power semiconductors. In addition, during the assembly, pins 118 of the electrical housing feedthrough are also fed from the motor housing 115 through appropriate openings in the bottom of the support frame structure 102 and project visibly therefrom.

Figure 5:
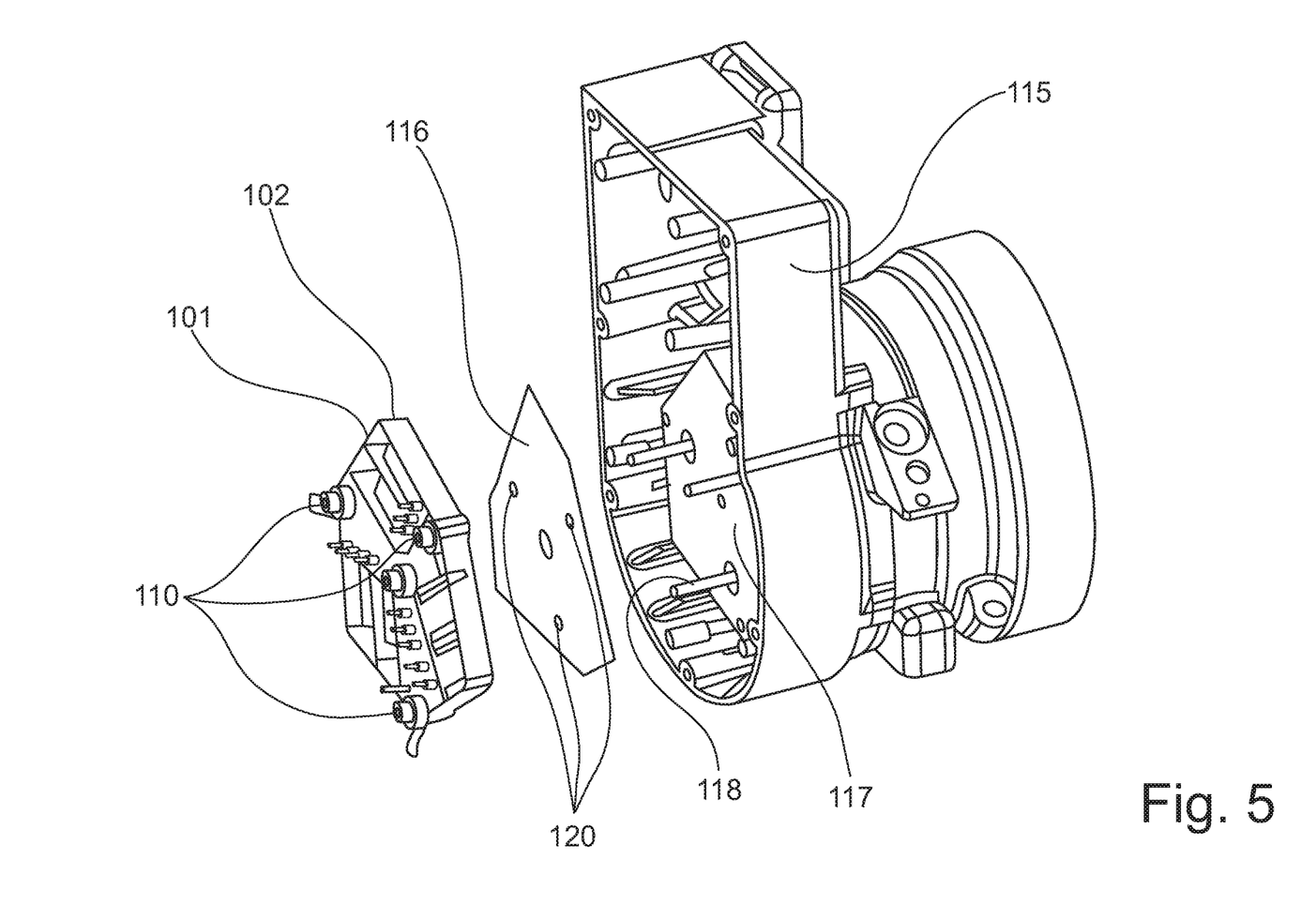
FIG. 5 shows an exploded representation of an assembly of motor housing with pins of electrical housing feedthroughs and with a cooling region, an intermediate layer of a an electrically insulating, thermally conductive material as well as with the mounting assembly with printed circuit board.

FIG. 5 shows an exploded representation of an assembly of the motor housing 115 with the pins 118 of the electric housing feedthrough and with a cooling region 117, an intermediate layer 116 of an electrically insulating, thermally conductive material as well as the mounting assembly 101. The mounting assembly 101 comprises the support frame structure 102, on the underside (not visible) of which the power semiconductors are embedded in hollow receiving volumes. The motor housing 115 comprises in the region for the mounting of the support frame structure 102, cooling regions 117, through which flows a coolant, as well as pins 118 oriented perpendicularly to the cooling region 117 of electrical housing feedthroughs. In comparison to the embodiment example according to FIG. 2 the three pins 118 of the electrical housing feedthrough are spaced further apart in a substantially triangular configuration. The bottom 115 of the support frame structure 102 comprises corresponding passage openings such that the pins 118 of the electrical housing feedthrough during assembly also project through the support frame structure 102. The mounting assembly 101 is secured by means of bolts 110 on the motor housing 115, wherein the support frame structure 102 with its underside, on which the power semiconductors are embedded in hollow receiving volumes, is pressed against the region of the motor housing 115 in which the cooling regions 117 and pins 118 of the electrical housing feedthroughs are located. To improve the thermal conductivity and to insulate the power semiconductors and the busbars electrically from the cooling regions, an intermediate layer 116 of electrically insulating, thermally conductive material is placed underneath the mounting assembly such that the thermally conductive material is located between the cooling regions 117 of the motor housing 115 and the power semiconductors 103. The intermediate layer comprises three triangularly arranged cutouts 120 for all three pins 118 of the electrical housing feedthrough.

Figure 6:
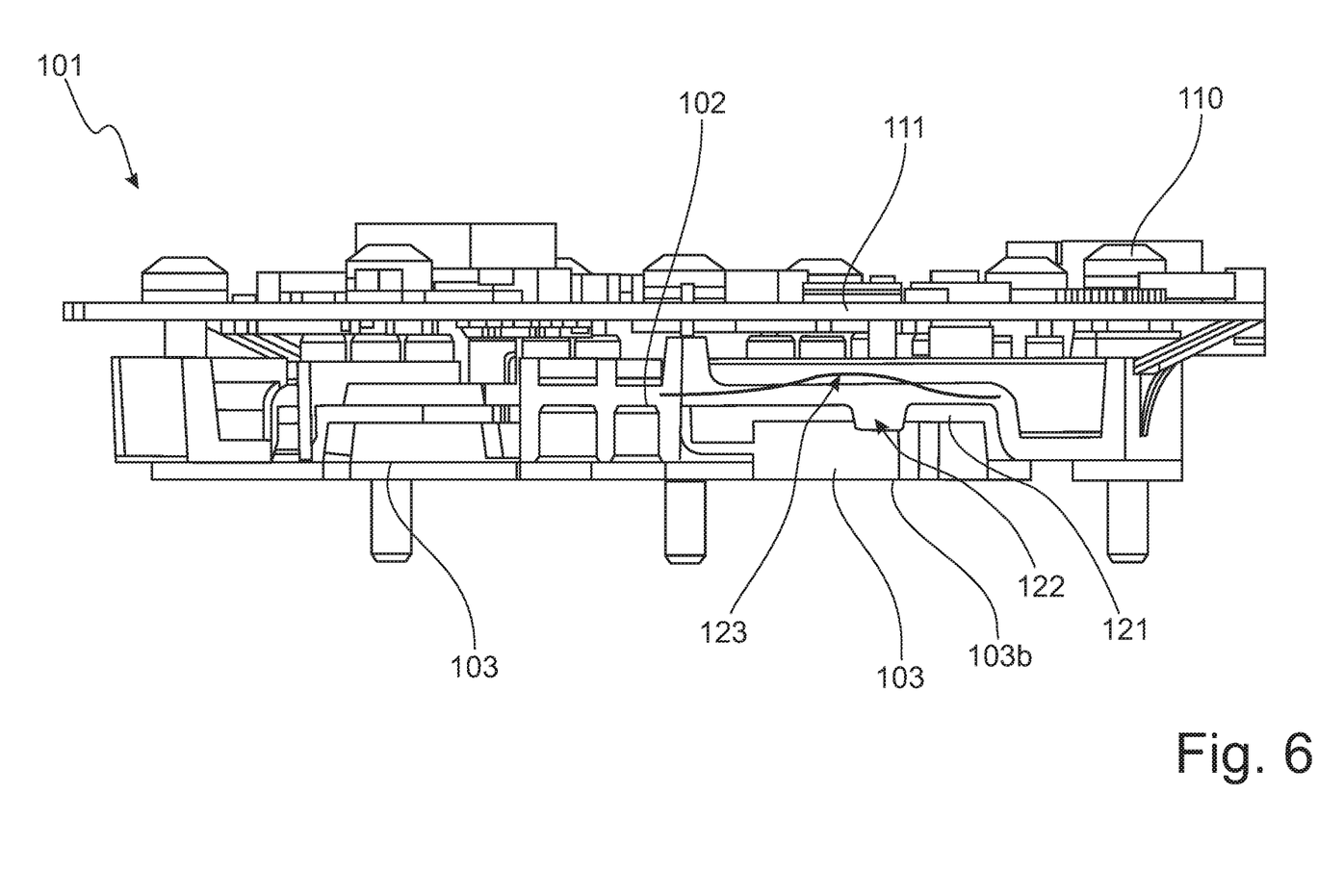
FIG. 6 shows a sectional representation of the mounting assembly with the power semiconductors in the bolted state.

FIG. 6 shows a sectional representation of the mounting assembly 101 with the power semiconductors 103 in the bolted together state. The support frame structure 102 is positioned underneath the printed circuit board 111 of the inverter. The support frame structure 102 comprises on the underside hollow receiving volumes 121 for each power semiconductor 103, wherein these hollow receiving volumes 121 are each downwardly open. The power semiconductors 103, in the depicted example bipolar transistors with insulated gate (IGBT), are positioned in these hollow receiving volumes 121, and therewith within the support frame structure 102, wherein the downwardly facing surface 103b of the power semiconductor 103 are not covered by the support frame structure 102 due to the position of the opening of the hollow receiving volume 121. Each hollow receiving volume 121 comprises a contact region in the form of a contact element 122 developed for localized contact of the hollow receiving volume 121 in places with the upper surface 103c of the power semiconductor 103. In the state mounted within the motor housing of the compressor, only shown schematically in FIG. 6 without the motor housing, the support frame structure 102 is pressed Through a multiplicity of bolts 110 against the, also not shown, cooling region of the motor housing. The support frame structure 102 itself comprises in the region above the hollow receiving volumes a resilient element 123 and therewith has a resiliency such that the adaptation of the support frame structure 102 on discrepancies in the thickness of the power semiconductor is enabled through the flexing of this resilient element 123 of the support frame structure 102. The flexure of the resilient region or element 123 of the support frame structure 102 in the bolted state is depicted schematically in FIG. 6. Bolts 110 and contact elements 122 are placed in such manner that no mechanically static overdetermination occurs. In each case there are always two power semiconductors 103 disposed between two bolts 110 as is also shown in FIG. 4B. It is thereby enabled that all power semiconductors 103 are pressed with the appropriate contact force with their lower surface 103b uncovered by the support frame structure 102 onto the motor housing of the compressor.

LIST OF REFERENCE NUMBERS

1 Mounting assembly with wire-leaded electronic power components
2 Support frame structure
3 Power semiconductor
3a Connector pins
3b Downwardly facing surface of the power semiconductor
3c Upwardly facing surface of the power semiconductor
4 Busbar
4a Busbar ends
5 Bottom of support frame structure
6 Side edging of support frame structure 7 Openings for connector pins of the power semiconductors
8 Openings for busbar ends
9 Sleeves
10 Bolts
10a Bolt head
11 Printed circuit board
12 Openings for connector pins in the printed circuit board
13 Openings for busbar ends in the printed circuit board
14 Openings for sleeves and bolts in the printed circuit board
15 Motor housing
16 Intermediate layer of electrically insulating, thermally conductive material
17 Cooling region
18 Pin of electrical housing feedthrough
19 Cutout in the intermediate layer for bolts
20 Cutout in the intermediate layer for the pins of the electrical housing feedthrough
21 Hollow receiving volume for power semiconductors
22 Contact region
23 Flexure of the inner support frame structure
101 Mounting assembly with wire-leaded electronic power components
102 Support frame structure
103 Power semiconductor
103a Connector pins
103b Downwardly facing surface of power semiconductor
103c Upwardly facing surface of power semiconductor
105 Bottom of support frame structure
106 Side edging of support frame structure
107 Openings for connector pins of the power semiconductors
110 Bolts
111 Printed circuit board
112 Openings for connector pins of the power semiconductors in the printed circuit board
115 Motor housing
116 Intermediate layer of electrically insulating, thermally conductive material
117 Cooling region
118 Pin of electrical housing feedthrough
120 Cutout in the intermediate layer for the pins of the electrical feedthrough
121 Hollow receiving volume for power semiconductor
122 Contact element
123 Resilient element of the support frame structure

The invention claimed is:

1. A mounting assembly with wire-leaded electronic power components for an inverter of an electric compressor of a climate control system, comprising a support frame structure with a bottom forming an upper side and an underside of the frame support structure and comprising a multiplicity of passages from the upper side to the underside for securement elements for securing the support frame structure on a motor housing, wherein on the underside of the bottom a hollow receiving volume or a multiplicity of hollow receiving volumes is or are implemented in which a leaded power module or a multiplicity of discrete leaded power semiconductors is embedded, and wherein in each hollow receiving volume a contact region for a localized contact in places of the hollow receiving volume with an upwardly facing surface of the power semiconductor or power module is developed, while the opposing, downwardly facing surface of the power semiconductor forms a portion of the lower outer surface area of the mounting assembly and wherein the support frame structure comprises above the hollow receiving volumes a resilient region which is flexible in the direction of the thickness of the power semiconductors or of the power module compared to the other regions of the support frame structure.

2. A mounting assembly as in claim 1, further comprising a multiplicity of busbars that are disposed within the support frame structure.

3. A mounting assembly as in claim 2, wherein the support frame structure on the underside of the bottom comprises grooves adapted to the busbars, in which grooves the busbars are secured by press fit.

4. A mounting assembly as in claim 1, wherein the bottom of the support frame structure comprises openings through which connector pins of the leaded power semiconductors or of the leaded power module are introduced and extend so far trough the support frame structure that, fed through a printed circuit board positioned on the support frame structure of the inverter, they can be soldered to the printed circuit board of the inverter.

5. A mounting assembly as in claim 2, wherein the busbar ends are introduced through suitable openings in bottom of the support frame structure and extend so far through the support frame structure that, fed through a printed circuit board, positioned on the support frame structure, of the inverter, they can be soldered to the printed circuit board of the inverter.

6. A mounting assembly as in claim 1, wherein between the contact region of the hollow receiving volume and the upwardly facing surface of the power semiconductor or of the power module there is line contact or point contact.

7. A mounting assembly as in claim 1, wherein the support frame structure is comprised of synthetic material.

8. A mounting assembly as in claim 1, wherein metal reinforcements coated with synthetic material or metal reinforcements within the support frame structure are utilized within the support frame structure.

9. An assembly of a mounting assembly as in claim 1 comprising a motor housing of a compressor, wherein the support frame structure is secured through a multiplicity of bolts on the motor housing and therein the power semiconductors disposed in the support frame structure or the power module is/are pressed against a cooling region.

10. An assembly as in claim 9, wherein an intermediate layer of an electrically insulating, thermally conductive material is placed underneath the mounting assembly between the mounting assembly and the cooling region of the motor housing.

11. An assembly as in claim 9, wherein in cases in which discrete power semiconductors are employed, no more than two power semiconductors are placed between two bolts.

12. A mounting assembly according to claim 2, wherein metal reinforcements coated with synthetic material or metal reinforcements within the support frame structure are utilized within the support frame structure.

13. A mounting assembly according to claim 3, wherein metal reinforcements coated with synthetic material or metal reinforcements within the support frame structure are utilized within the support frame structure.

14. A mounting assembly according to claim 4, wherein metal reinforcements coated with synthetic material or metal reinforcements within the support frame structure are utilized within the support frame structure.

15. A mounting assembly according to claim 5, wherein metal reinforcements coated with synthetic material or metal reinforcements within the support frame structure are utilized within the support frame structure.

16. A mounting assembly according to claim 6, wherein metal reinforcements coated with synthetic material or metal reinforcements within the support frame structure are utilized within the support frame structure.

17. A mounting assembly as in claim 2, wherein between the contact region of the hollow receiving volume and the upwardly facing surface of the power semiconductor or of the power module there is line contact or point contact.

18. A mounting assembly as in claim 3, wherein between the contact region of the hollow receiving volume and the upwardly facing surface of the power semiconductor or of the power module there is line contact or point contact.

19. A mounting assembly as in claim 4, wherein between the contact region of the hollow receiving volume and the upwardly facing surface of the power semiconductor or of the power module there is line contact or point contact.

20. A mounting assembly as in claim 5, wherein between the contact region of the hollow receiving volume and the upwardly facing surface of the power semiconductor or of the power module there is line contact or point contact.

\* \* \* \* \*